(12) United States Patent
Chan (10) Patent No.: US 6,437,597 B1
(45) Date of Patent: Aug. 20, 2002

(54) METHODS AND CIRCUITS FOR PRECISE EDGE PLACEMENT OF TEST SIGNALS

(75) Inventor: Siuki Chan, Cupertino, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 09/834,214

(22) Filed: Apr. 11, 2001

(51) Int. Cl.[7] ................. H03K 19/00; H03K 19/177
(52) U.S. Cl. ............................. 326/16; 326/41
(58) Field of Search ...................... 326/16, 38–41, 326/47; 331/57

(56) References Cited

U.S. PATENT DOCUMENTS

| | | |
|---|---|---|
| 4,792,932 A | 12/1988 | Bowhers et al. |
| 4,878,209 A | 10/1989 | Bassett et al. |
| 4,890,270 A | 12/1989 | Griffith |
| 5,083,299 A * | 1/1992 | Schwanke et al. .......... 368/113 |
| 5,606,567 A | 2/1997 | Agrawal et al. |
| 6,020,760 A * | 2/2000 | Sample et al. ................ 326/41 |
| 6,075,418 A | 6/2000 | Kingsley et al. |
| 6,134,191 A | 10/2000 | Alfke |

OTHER PUBLICATIONS

U.S. application No. 09/737,996, Chan et al., filed Dec. 14, 2000.
U.S. application No. 09/329,962, Matera, filed Jun. 10, 1999.
"The Programmable Logic Data Book", 1999, available from Xilinx, Inc. 2100 Logic Drive, San Jose, CA 95124, pp. 3–3 to 3–22 and 4–3 to 4–69.

* cited by examiner

*Primary Examiner*—Michael Tokar
*Assistant Examiner*—James H Cho
(74) *Attorney, Agent, or Firm*—Arthur J. Behiel; Edel M. Young (57) ABSTRACT

A test configuration for a programmable logic device (PLD) measures and stores the relative signal-propagation delays of a pair of signal paths extending into the PLD from PLD input pins. The PLD is configured to instantiate a ring oscillator that selectively includes either signal path in the ring. The oscillator exhibits a first oscillation period when the oscillator includes the first signal path, and exhibits a second oscillation period when the oscillator includes the second signal path. The difference between the first and second periods provides a measure of the difference between the signal propagation delays of the two paths of interest.

16 Claims, 5 Drawing Sheets

METHODS AND CIRCUITS FOR PRECISE EDGE PLACEMENT OF TEST SIGNALS

FIELD OF THE INVENTION

This invention relates generally to automatic test equipment for programmable logic devices, and in particular to methods and circuits for precisely placing signal transitions on the input pins of programmable logic devices.

BACKGROUND

Most semiconductor devices are tested at least once using some form of automated test equipment (generally, a "tester"). Testers generally have a "per-pin" architecture in which separate "channels" within the tester generate or measure one signal corresponding to a single input or output pin on a device under test (DUT). Each channel is separately controlled to generate or measure a different signal. A pattern generator, the function of which is to send commands to each channel to generate or measure one test signal for each of many test periods, controls the various channels. Each channel generally contains at least one edge generator programmed to generate a signal transition, or "edge," at a certain time relative to the start of each test period.

Testers must place accurately timed edges at the various pins of a device under test to make accurate pin-to-pin measurements. When properly calibrated, testers with hundreds or even thousands of channels are only able to reduce the relative error between channels to somewhere in the range of ±500 ps to ±1 ns. All measurements require at least two edges be placed, so the cumulative measurement error inherent in the tester can contribute somewhere between 1 ns and 2 ns of uncertainty. Unfortunately, this inherent tester error often exceeds the value of the parameter being measured. To make matters worse, the test boards used to connect the tester channels to device pins can contribute different delays for different channels, adding to the timing uncertainty. There is therefore a need for a means of more precisely placing edges on the pins of devices under test.

A number of engineers employed by Xilinx, Inc., the assignee of the present application, addressed the need for a more precise means of placing edges. The resulting invention is described in U.S. patent application Ser. No. 09/737,996 entitled "Circuit For Measuring Signal Delays of Synchronous Memory Elements," by Siuki Chan and Christopher H. Kingsley, which is incorporated herein by reference. A relevant portion of that application is reproduced below in connection with FIGS. 1–3.

Figure 1:
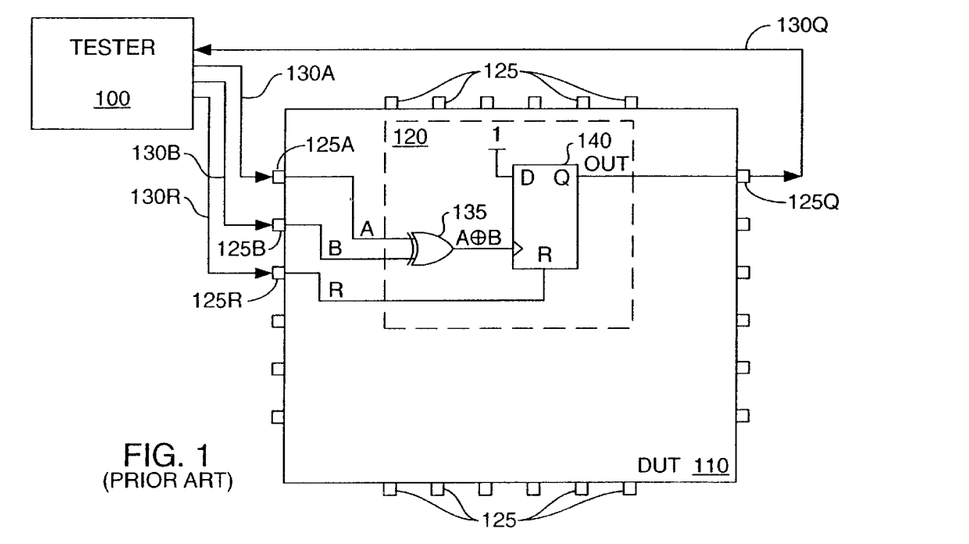
FIG. 1 depicts a conventional tester 100 connected to a device under test (DUT) 110.

FIG. 1 depicts a conventional tester 100 connected to a device under test (DUT) 110. In the example, DUT 110 is a field programmable gate array (FPGA). DUT 110 includes a coincidence detector 120 that can be used to calibrate tester 100 to produce coincident edges on device input pins 125A and 125B, two of the many pins 125 on DUT 110.

Coincidence detector 120 connects to three input paths A, B, and R and an output path OUT. These four paths connect to respective tester leads 130A, 130B, 130R, and 130Q through respective device pins. Coincidence detector 120 includes an XOR gate 135 and a flip-flop 140. Tester 100 initializes coincidence detector 120 by presenting a positive pulse on lead 130R, thus resetting flip-flop 140.

In one embodiment, DUT 110 is a Virtex™ FPGA available from Xilinx, Inc., of San Jose, Calif. Virtex™ FPGAs include configurable logic blocks that can be configured to instantiate coincidence detector 120. For more information about Virtex™ and other types of FPGAs for use with the invention, see, for example, pages 3—3 thru 3–22 and 4–3 thru 4–69 of "The Programmable Logic Data Book," (1999) from Xilinx, Inc., incorporated herein by reference.

Figure 2A:
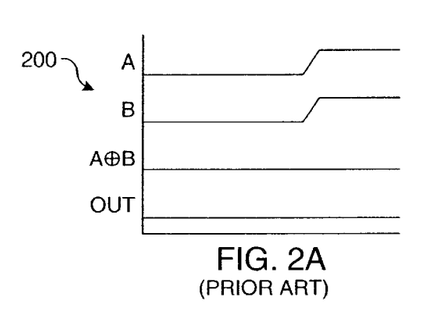
FIG. 2A is a waveform diagram 200 illustrating the case in which simultaneous edges of the same polarity are presented on each of pins 125A and 125B.

FIG. 2A is a waveform diagram 200 illustrating the case in which simultaneous edges of the same polarity are presented on each of pins 125A and 125B. As is conventional, XOR gate 135 outputs a logic one if the signals on input paths A and B have opposite logic levels (i.e., A=1 and B=0 or A=0 and B=1). Because each of the signals on paths A and B transition at the same instant in FIG. 2A, the logic levels on paths A and B are always the same. The output of XOR gate 135 therefore remains a logic zero. Output path OUT also remains at logic zero in the absence of a positive-going edge to clock the flip-flop.

Figure 2B:
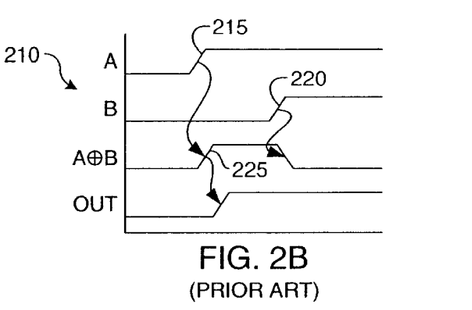
FIG. 2B is a waveform diagram 210 illustrating an edge (i.e., signal transition) 215 on path A arriving before an edge 220 on path B.

FIG. 2B is a waveform diagram 210 illustrating an edge (i.e., signal transition) 215 on path A arriving before an edge 220 on path B. XOR gate 135 will output a logic one during the time separating edges 215 and 220 when the signals on paths A and B are at opposite logic levels. The positive-going edge 225 on the output of XOR gate 135 will clock flip-flop 140, causing flip-flop 140 to store the logic one on data terminal D and to output the stored level on output path OUT. The logic one on output path OUT indicates that edges 215 and 220 are not coincident.

Figure 2C:
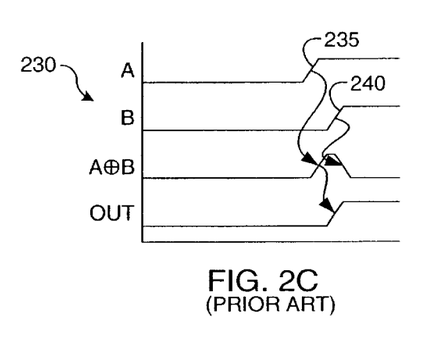
FIG. 2C is a waveform diagram 230 illustrating an edge 235 on path A arriving before an edge 240 on path B.

FIG. 2C is a waveform diagram 230 illustrating an edge 235 on path A arriving before an edge 240 on path B. The edges are closer than in FIG. 2B, so XOR gate 135 outputs a logic one for a shorter period. The short pulse is still sufficient to clock flip-flop 140, so flip-flop 140 outputs a logic one, indicating that edges 235 and 240 are not coincident.

Figure 2D:
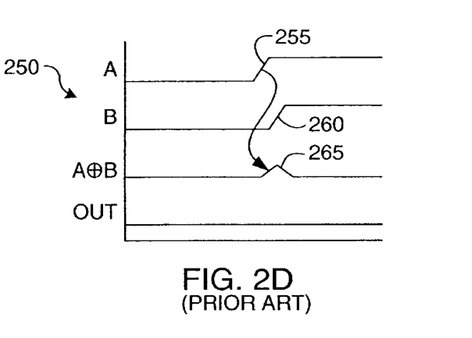
FIG. 2D is a waveform diagram 250 illustrating an edge 255 on path A arriving only slightly before an edge 260 on path B.

FIG. 2D is a waveform diagram 250 illustrating an edge 255 on path A arriving only slightly before an edge 260 on path B. The signal transitions are spaced far enough apart so that XOR gate 135 exhibits a small voltage spike 265. However, the small spike is insufficient to clock flip-flop 140, and therefore does not affect a change on line OUT. Thus, coincidence detector 120 will indicate coincident signals although edges 255 and 260 are not exactly coincident. The maximum delay between edges for which coincidence detector 120 indicates coincidence determines the resolution of coincidence detector 120, and may vary considerably depending upon the selected type of coincidence detector.

Figure 3:
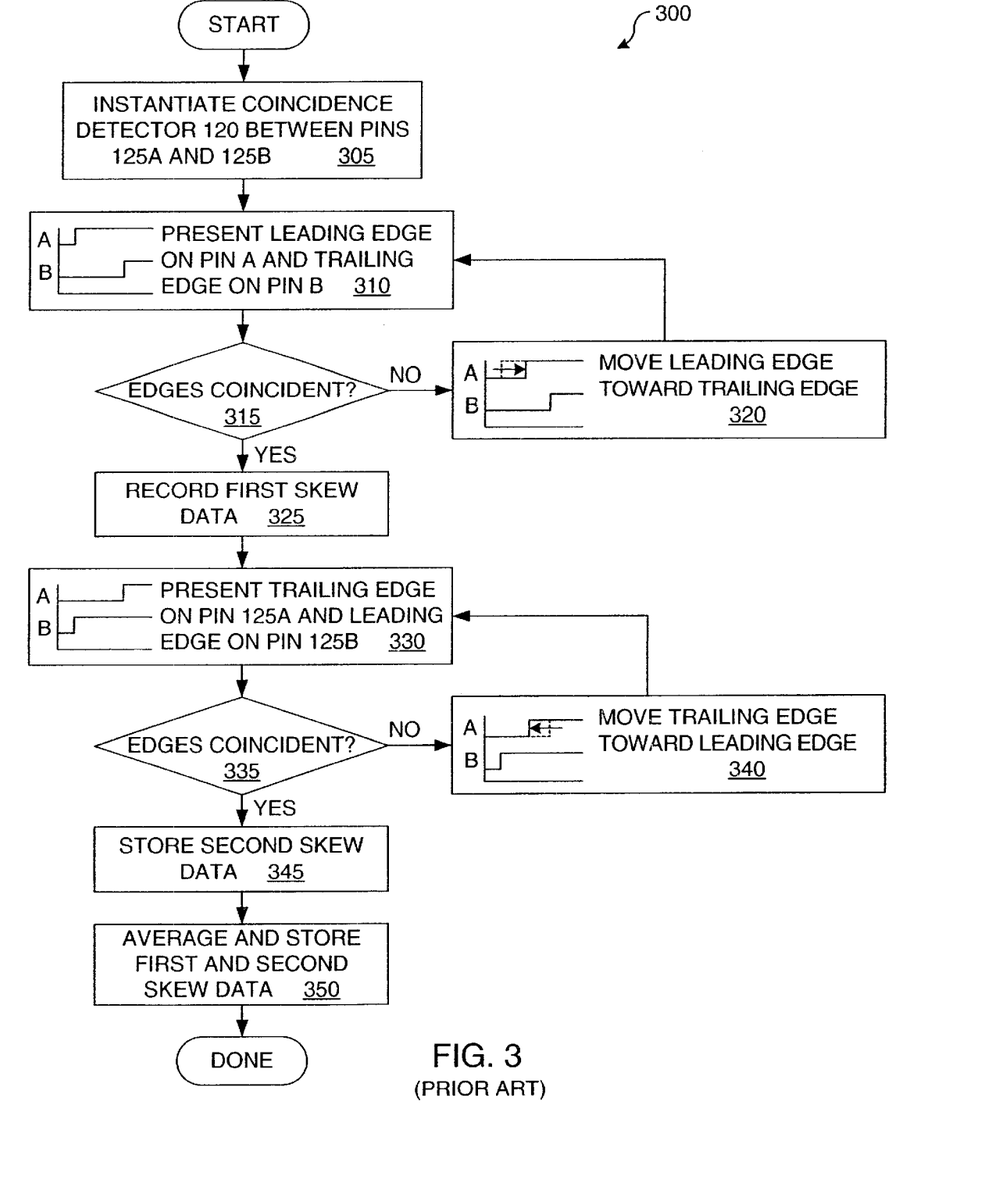
FIG. 3 is a flowchart 300 illustrating a method for estimating the skew between pins 125A and 125B of FIG. 1.

FIG. 3 is a flowchart 300 illustrating a method for estimating the skew between pins 125A and 125B of FIG. 1. First coincidence detector 120 is instantiated on DUT 110 (step 305). In an embodiment in which DUT 110 is an FPGA, coincidence detector 120 can be created from configurable logic using conventional FPGA programming techniques.

Tester 100 places edges on each of pins 125A and 125B (step 310). These edges are spaced sufficiently in time to ensure coincidence detector 120 indicates the signals are not coincident. In the example of FIG. 3, the edge on pin 125A leads the edge on pin 125B. Then, using the following sequence of steps, the spacing between the two edges is reduced incrementally until coincidence detector 120 indicates the edges are coincident.

Assuming the edges are sufficiently spaced for coincidence detector 120 to output a logic one (decision 315), the channel in tester 100 corresponding to pin 125A is adjusted to move the leading edge on pin 125A toward the trailing edge on pin 125B (step 320). Adjusting the delay associated with a given channel is well within the skill of those familiar with operating testers. Coincidence detector 120 is then reset and the process returns to step 310 in which the new pair of edges, now more closely spaced, are presented on pins 125A and 125B.

By cycling through steps 310, 315, and 320, the delay separating the edges on pins 125A and 125B is incrementally reduced until coincidence detector 120 indicates that the two edges are coincident (in decision 315). The relative timing of the two edges (i.e., the first skew data) is then recorded (step 325), in memory within tester 100, for example.

Next, tester 100 again places edges on each of pins 125A and 125B (step 330). This time, however, the edge on pin 125A is set to trail the edge on pin 125B by an amount sufficient to ensure that coincidence detector 120 indicates that the signals are not coincident. Then, using the following sequence of steps, the spacing between the two edges is reduced incrementally until coincidence detector 120 again indicates the edges are coincident.

Assuming the edges are not sufficiently coincident for coincidence detector 120 to output a logic one (decision 335), the channel in tester 100 corresponding to pin 125A is adjusted to move the trailing edge on. pin 125A toward the leading edge on pin 125B (step 340). Coincidence detector 120 is then reset and the process returns to step 330 in which the new pair of edges, now more closely spaced, are presented on pins 125A and 125B.

By cycling through steps 330, 335, and 340, the delay separating the edges on A and B is again incrementally reduced until coincidence detector 120 indicates the two edges are coincident (in decision 335). The relative timing of the two edges (i.e., the second skew data) is then recorded in local memory within tester 100 (step 345).

In an illustrative example, the transition on pin 125B is held to a delay of 150 ps with respect to some reference as the transition on pin 125A is swept upward from 0 ps, in minimum increments equal to the tester resolution, for example 10 ps, from the same reference (larger increments can be used to approach coincidence). Coincidence detector 120 first indicates coincidence when the delay imposed on the edge on pin 125A is 240 ps from the reference. Next, the edge on pin 125B is held to a delay of 150 ps as the transition on pin 125A is swept downward from 1 ns. This time, coincidence detector 120 indicates coincidence when the delay imposed on the edge on pin 125A is 320 ps from the reference. From the exemplary data, one can assume the edges would be exactly coincident if tester 100 is set to provide the edge on pin 125A between 240 and 320 ps from the reference, or, subtracting the 150 ps delay associated with the edge on pin 125B, between 90 and 170 ps from the edge on pin 125B.

As a first approximation, the edges are deemed coincident at the midpoint (i.e., the average) of the 240 and 320 ps extremes, or at 280 ps from the reference. One can therefore conclude that imposing a delay of 130 ps (i.e., 280 ps–150 ps) on pin 125A and zero delay on pin 125B will produce simultaneous transitions on pins 125A and 125B. The 130 ps average skew is then stored in memory in tester 100 (step 350).

To ensure the accuracy of skew data acquired using the above process, the measurements can be repeated in reverse order (i.e., beginning with the trailing edge on pin A), and/or sweeping the edge on pin B relative to pin A. The results of these tests can then be averaged.

Having discovered that the true skew between pins 125A and 125B is 130 ps, tester 100 can be set to delay edges on pin 125A by 130 ps relative to edges on pin 125B to provide coincident edges on respective pins 125A and 125B. And, once the skew is known for pins 125A and 125B in a particular test configuration, this knowledge can be used to precisely measure the performance of other circuits within DUT 110 that receive input signals on pins 125A and 125B.

Skew data similar to that obtained above for pins 125A and 125B is useful for each pin 125 on DUT 110. The method can be extended to obtain precise skew data for every pin relative to every other pin.

The method of FIGS. 1–3 works well, but does not take into account potential differences between the signal-propagation delays of the signal paths A and B from pins 125A and 125B to the respective input terminals of coincidence detector 120. Selecting similar paths can minimize these differences, but this is not always convenient and does not guarantee identical delays. There is therefore a need for a way to account for any differences between the signal propagation delays of paths leading to the coincidence detector.

SUMMARY

The invention is directed to methods and circuits for accurately placing signal transitions, or "edges," simultaneously on two or more pins of a programmable logic device (PLD). A test configuration in accordance with the invention measures the relative signal-propagation delays of a pair of signal paths A and B extending from respective PLD input pins to interior portions of the PLD. The difference between the signal-propagation delays is then stored for use in subsequent deskew operations.

In accordance with one embodiment of the invention, the signal-propagation delays of the signal paths are measured using a ring oscillator. The PLD is configured to instantiate the ring oscillator to selectively include either signal path in the ring. The oscillator exhibits a first oscillation period when the oscillator includes the first signal path, and exhibits a second oscillation period when the oscillator includes the second signal path. The difference between the first and second periods provides a measure of the difference between the signal propagation delays of the two paths of interest.

Having accounted for the delay difference between the two paths, the PLD is configured to include a coincidence detector having first and second input terminals each-connected to one of the signal paths. A conventional tester then applies substantially simultaneous signal transitions on each of the first and second PLD input pins. The tester adjusts the relative timing of the signal transitions until the coincidence detector indicates the transitions are coincident. The amount of offset necessary to provide coincident edges is then added to the difference between the signal-propagation delays associated with two paths. The resulting sum is stored in a database for later use in deskewing edges applied to the first and second PLD input pins.

The claims, and not this summary, define the scope of the invention.

DETAILED DESCRIPTION

Figure 4:
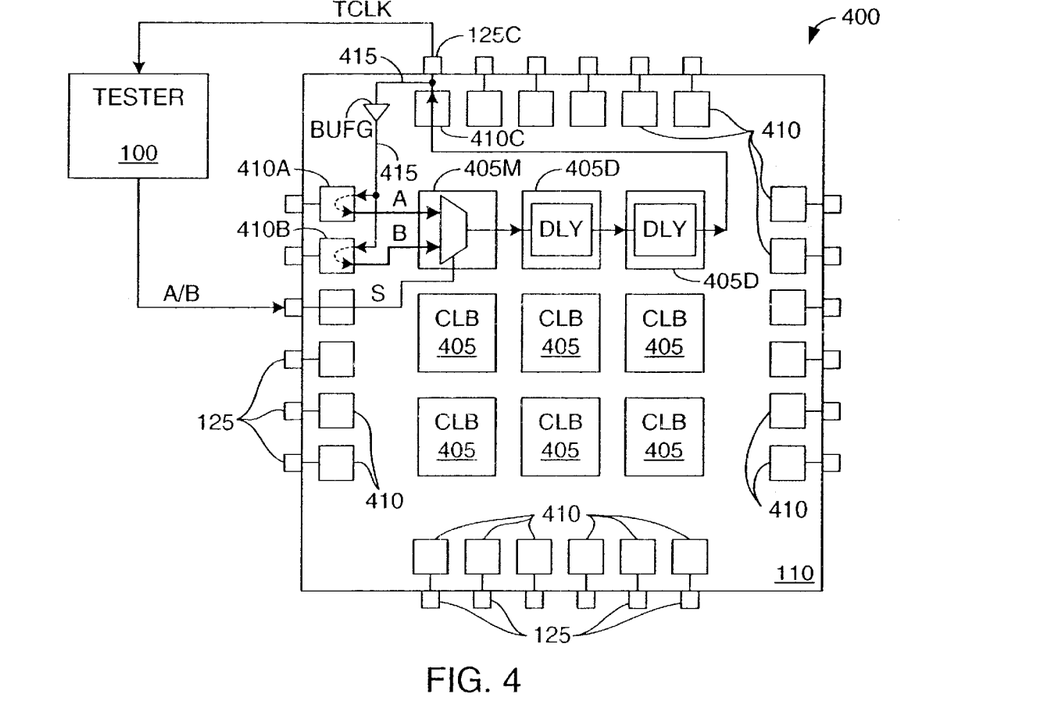
FIG. 4 depicts a test configuration 400 in accordance with the invention that measures the relative signal-propagation delays of a pair of signal paths A and B.

FIG. 4 depicts a test configuration 400 in accordance with the invention that measures the relative signal-propagation delays of a pair of signal paths A and B. These delays, once known, can be accounted for when minimizing tester skew using the methods described above in connection with FIGS. 1–3.

System 400 includes the conventional tester 100 and FPGA 110 of FIG. 1. FPGA 110 includes an array of configurable logic blocks 405, or CLBs, that are programmably interconnected to each other and to programmable input/output blocks 410 (IOBs). As is well understood by those of skill in the art, this collection of configurable logic may be customized by loading configuration data into internal configuration memory cells (not shown) that define how the CLBs, interconnections, and IOBs are configured.

FPGA 110 additionally includes a clock distribution network, a portion of which is depicted as global clock lines 415 and global clock buffer BUFG. The input of buffer BUFG can be connected to an external clock source (not shown) via an I/O pin 125C. In some FPGAs, global clock line 415 can be programmably connected to any of CLBs 405 or IOBs 410.

In accordance with the invention, FPGA 110 is configured to instantiate a ring oscillator that selectively includes one of signal paths A and B of FIG. 1. The oscillator exhibits a first oscillation period when the signal path includes signal path A, and exhibits a second oscillation period when the signal path includes signal path B. The difference between the first and second periods provides a measure of the difference between the signal propagation delays of paths A and B. Accounting for this difference allows test engineers to further reduce tester skew when employing the methods described above in connection with FIGS. 1–3.

The ring oscillator in the depicted embodiment is instantiated as follows. A pair of IOBs 410A and 410B are configured to output a signal edge in response to a clock edge. (An appropriate IOB configuration for a Virtex™ FPGA is described below in connection with FIG. 5.) Output terminals from IOBs 410A and 410B are connected via respective signal paths A and B to input terminals of a CLB 405M configured as a two-input multiplexer. The select terminal S of the multiplexer connects to tester 100 via a test lead A/B.

Additional CLBs, two CLBs 405D in the example, are connected in series with CLB 405 to produce some signal-propagation delay. The output terminal from this series of delay elements connects, via the programmable interconnect and an IOB 410C, to I/O terminal 125C and the input of global buffer BUFG. Output line 415 from buffer BUFG then connects to IOBs 410A and 410B.

The multiplexer of CLB 405M selects signal path A when tester 100 produces a first logic level on line A/B (e.g., a logic 1). The ring of connected elements is configured to oscillate, so rising and falling edges propagate through CLBs 405M and 405D and through IOBs 410A and 410C. This oscillating signal can be sampled on pin 125C so tester 100 can measure the period when the ring oscillator incorporates signal path A.

The multiplexer of CLB 405M selects signal path B when tester 100 produces a second logic level on line A/B (e.g., a logic 0). The ring of connected elements is configured to oscillate, so rising and falling edges propagate through CLBs 405M and 405D and through IOBs 410B and 410C. As before, the oscillating signal can be sampled on pin 125C so tester 100 can measure the period when the ring oscillator incorporates signal path B.

The difference between the oscillation periods associated with signal paths A and B is primarily due to the different signal propagation delays of signal paths A and B. Other factors contribute to the difference, such as the signal-propagation delay along clock line 415 between IOBs 410A and 410B; however, these differences are typically relatively small. The global clock distribution network connects IOBs 410A and 410B via a continuous metal line, whereas signal paths A and B are formed using programmable interconnect lines that are relatively more resistive. Thus, the difference between the periods is a good indication of the difference between the delays associated with paths A and B.

Figure 5:
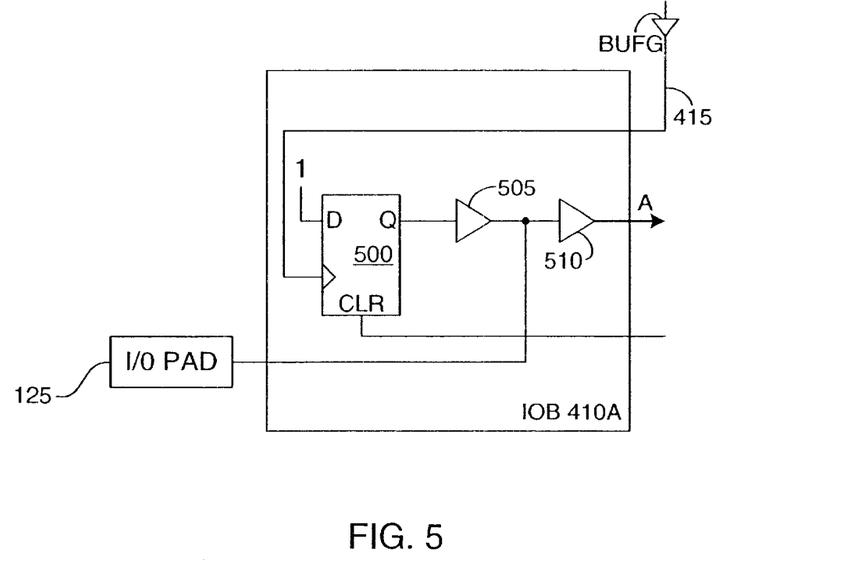
FIG. 5 depicts the configuration of IOB 410A (IOB 410B is similarly configured).

FIG. 5 depicts the configuration of IOB 410A (IOB 410B is similarly configured). Global clock line 415 connects to the clock input terminal of an output flip-flop 500. The Q output terminal of flip-flop 500 connects to one of I/O pads 125 via a buffer 505 and to signal path A via buffer 505 and a second buffer 510. The clear terminal CLR of flip-flop 500 connects to other components described below in connection with FIG. 6. IOB 410A conventionally includes many other programmable elements; these are omitted for brevity. For a more detailed discussion of IOBs 410 and other components of a device suitable for use with the invention, see U.S. patent application Ser. No. 09/329,962, entitled "Circuit and Method for Testing Whether a Programmable Logic Device Complies With a Zero-Hold-Time Requirement," by Michael M. Matera, which is incorporated herein by reference.

Figure 6:
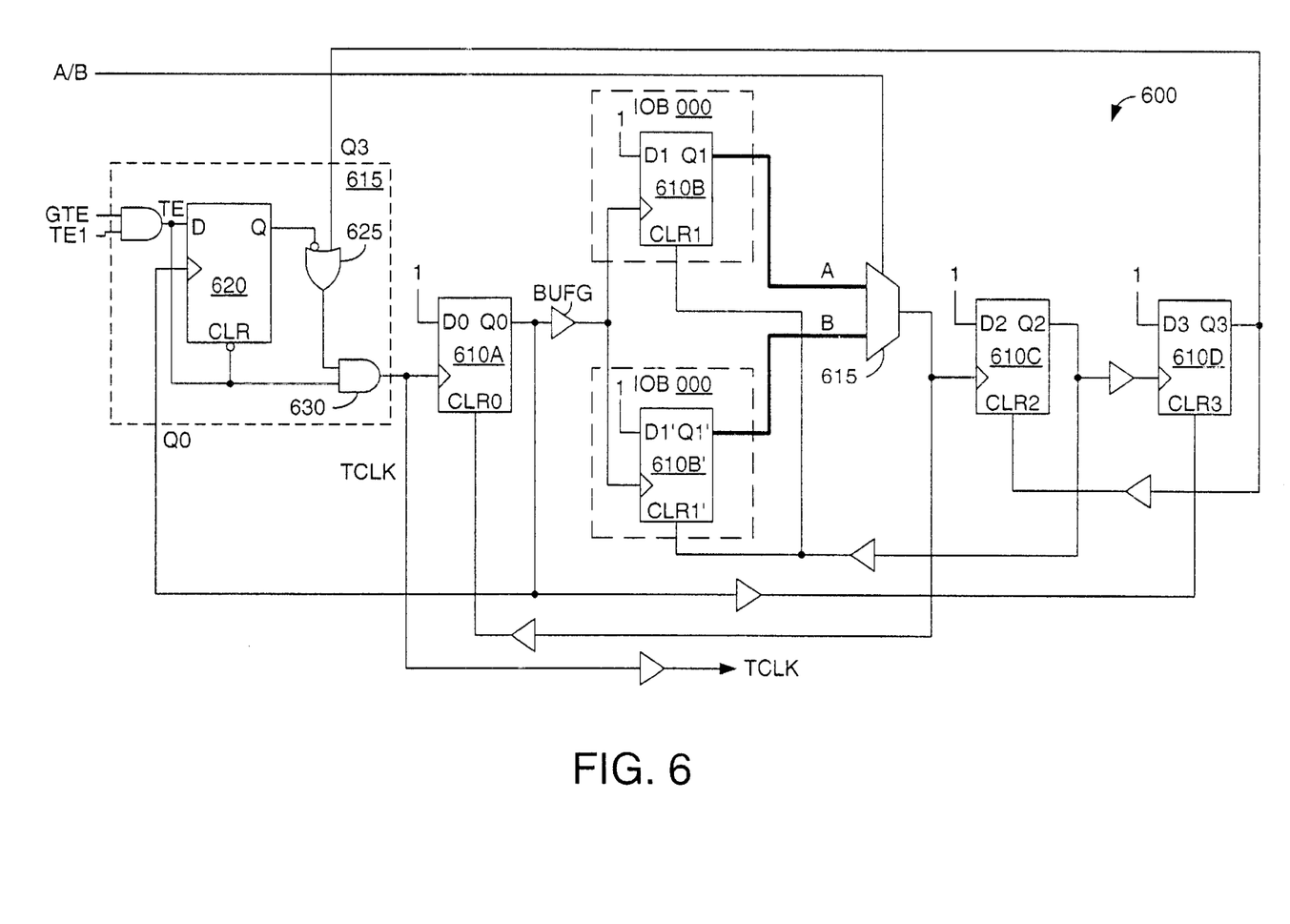
FIG. 6 is a schematic diagram of an oscillator 600 that can be instantiated on an FPGA in accordance with the invention.

FIG. 6 is a schematic diagram of an oscillator 600 that can be instantiated on an FPGA in accordance with the invention. Oscillator 600 alternatively produces one of two oscillating test signals, each having a period including the clock-to-out delays of four synchronous components, flip-flops 610A–610D. The respective periods of the two oscillating test signals will differ by some amount determined primarily by the signal propagation delay difference between signal paths A and B (depicted using bold lines).

The following discussion explains the operation of oscillator 600 in the event that control line A/B selects signal path A via a multiplexer 615; oscillator 600 operates in the same fashion in the event that control line A/B selects signal path B.

Oscillator 600 includes an oscillator-enable circuit 615 connected to the clock input of flip-flop 610A via a test-clock line TCLK. Oscillator-enable circuit 615 in turn includes a flip-flop 620, an OR gate 625 and an AND gate 630. Oscillator-enable circuit 615 produces a rising edge on test-clock line TCLK when global test-enable line GTE and local test-enable line TE1 are brought high. The rising edge causes oscillator 600 to begin oscillating. Returning test-enable line TE to a logic zero turns oscillator 600 off. (Providing a local test-enable line TE1 allows test engineers to select from among a number of test circuits on a signal device.)

A test-enable line TE, the ANDed global and local test-enable lines GTE and TE1, connects to a synchronous input terminal D of flip-flop 620, an asynchronous input terminal CLR of flip-flop 620, and an input terminal of AND gate 630. A global set/reset line (not shown) connected to the clear inputs of flip-flops 610A–610D can be temporarily brought high to initialize flip-flops 610A–610D before asserting test-enable signal TE. A synchronous output terminal Q of flip-flop 620 connects to an input of OR gate 625. The output terminal of OR gate 625 connects to the remaining input terminal of AND gate 630. Oscillator-enable circuit 615 also includes a pair of input lines Q0 and Q3 from respective flip-flops 610A and 610D: line Q0 connects to the clock input of flip-flop 620; line Q3 connects to the second input terminal of OR gate 625.

The synchronous "Q" output terminal of each flip-flop 610A–D is connected to:
 the clock terminal (conventionally designated using a ">" symbol) of a subsequent flip-flop, and
 an asynchronous clear terminal of a previous flip-flop.

For example, output terminal Q2 of flip-flop 610C connects to both the clock terminal of flip-flop 610D and the asynchronous clear terminal CLR1 of flip-flop 610B. Each rising edge on any given clock terminal thus propagates through to the subsequent flip-flop; the subsequent flip-flop then clears the preceding flip-flop to prepare the preceding flip-flop for the next rising edge. Each subsequent flip-flop thus acts as a synchronous delay element between the output terminal and the clear terminal of the previous flip-flop. Output terminal Q3 from flip-flop 610D is connected, through circuit 615, to the clock input of flip-flop 610A so that flip-flops 610A–D form a ring oscillator.

For a detailed description of oscillator 600 and some other oscillators suitable for use with the present. invention, see the above-incorporated co-pending U.S. Patent Application entitled "Circuit For Measuring Signal Delays of Synchronous Memory Elements."

Figure 7:
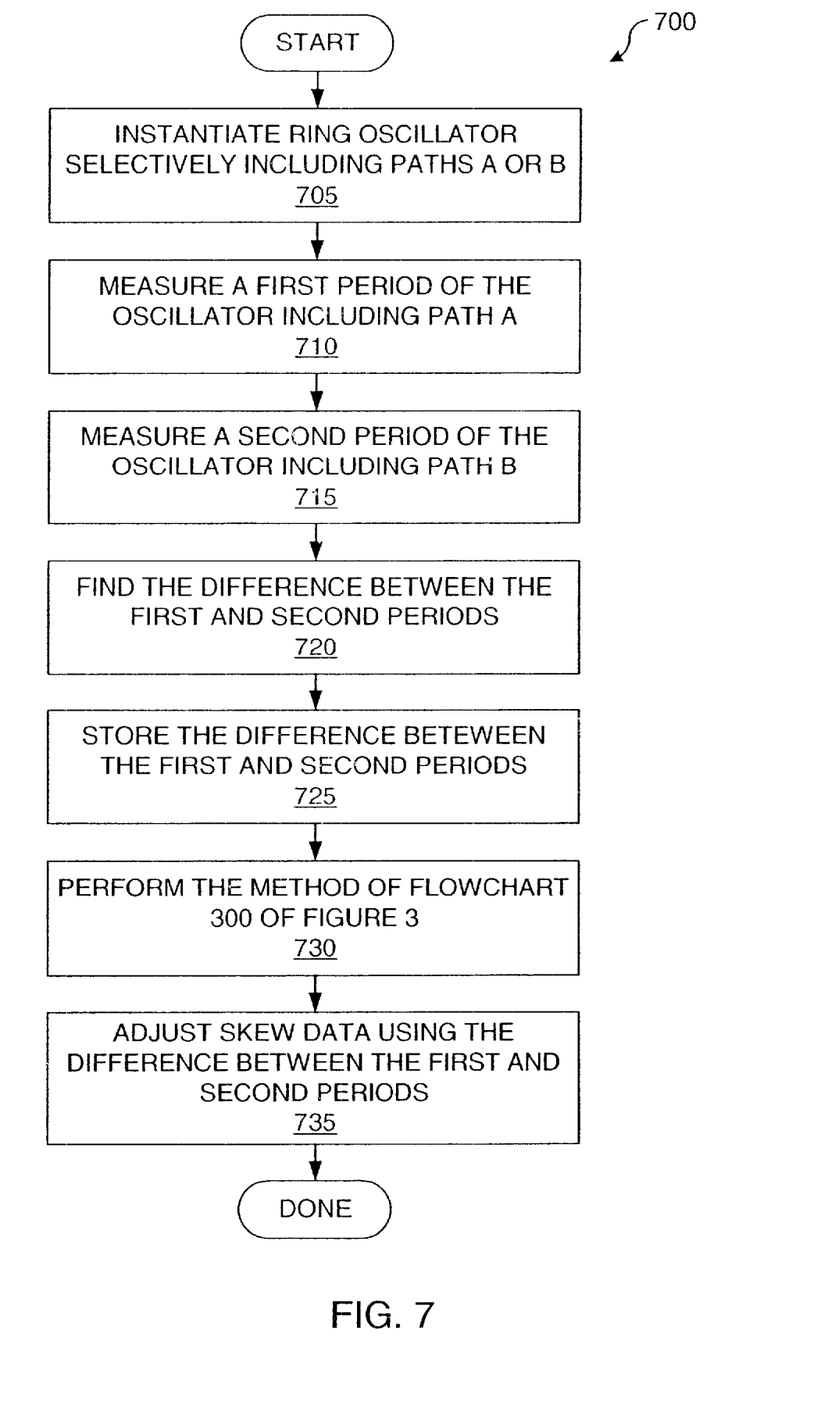
FIG. 7 is a flowchart 700 illustrating a method for estimating the skew between signal paths A and B of FIGS. 1, 4, and 6.

FIG. 7 is a flowchart 700 illustrating a method for estimating the skew between signal paths A and B of FIGS. 1, 4, and 6. The first step 705 is to instantiate a ring oscillator that includes the two paths of interest onto a programmable logic device, such as is shown in FIG. 4. The resulting oscillator is then set to include signal path A and the resulting oscillation period is measured and stored (step 710). Next, the oscillator is set to include signal path B and the resulting oscillation period is again measured and stored (step 715). The skew between signal paths A and B is then calculated in step 720 as the difference between the first and second periods. This difference is stored (step 725) for later use.

Having determined the skew between paths A and B, the method described above in connection with FIG. 3 is performed (step 730), making sure that coincidence detector 120 employs the same signal paths A and B for which skew data was obtained in steps 705–725. This method provides skew data for the two tester channels, but the skew data is off by the skew between signal paths A and B. Thus, the stored skew data attributable to paths A and B and stored in step 725 is used to adjust the tester skew data from step 730. The resulting adjusted skew data is a more accurate measure of the skew attributable to the tester.

While the present invention has been described in connection with specific embodiments, variations of these embodiments will be obvious to those of ordinary skill in the art. For example, configurable logic can be programmed to perform both multiplexing and coincidence-detecting functions so the PLD need not be reprogrammed to include the coincidence detector after the path delays are characterized. Other embodiments include additional signal paths for which the associated signal propagation delays are of interest. Moreover, some components are shown directly connected to one another while others are shown connected via intermediate components. In each instance the method of interconnection establishes some desired electrical communication between two or more circuit nodes, or terminals. Such communication may often be accomplished using a number of circuit configurations, as will be understood by those of skill in the art. Therefore, the spirit and scope of the appended claims should not be limited to the foregoing description.

What is claimed is:

1. A method of comparing a first propagation delay of a first path of interest programmably defined on a programmable logic device with a second propagation delay of a second path of interest on the programmable logic device, the method comprising:
 a. programming a first programmable resource to function as a multiplexer, the multiplexer having a first multiplexer input terminal, a second multiplexer input terminal, a multiplexer output terminal, and a select terminal, wherein a first logic level on the select terminal connects the first multiplexer input terminal to the multiplexer output terminal and a second logic level on the select terminal connects the second multiplexer input terminal to the multiplexer output terminal;
 b. connecting the multiplexer output terminal to the first multiplexer input terminal via the first path of interest;
 c. connecting the multiplexer output terminal to the second multiplexer input terminal via the second path of interest;
 d. providing the first logic level on the select terminal;
 e. propagating a first signal transition through the first path of interest to the first multiplexer input terminal, through the multiplexer, and back to the first path of interest, thereby generating a first periodic signal having a first period;
 f. providing the second logic level on the select terminal;
 g. propagating a second signal transition through the second path of interest to the second multiplexer input terminal, through the multiplexer, and back to the second path of interest, thereby generating a second periodic signal having a second period; and
 h. subtracting the second delay period from the first delay period to obtain a propagation-delay difference.

2. The method of claim 1, further comprising programming a second programmable resource to function as a delay element, the delay element having a delay-element input terminal connected to the multiplexer output terminal and a delay-element output terminal connected to the first and second multiplexer input terminals via the respective first and second paths of interest.

3. The method of claim 1, wherein the first and second paths of interest each include at least one programmable interconnect point.

4. The method of claim 1, further comprising connecting the multiplexer output terminal to the first and second multiplexer input terminals via a global clock network.

5. The method of claim 1, wherein the first path of interest extends from a first programmable input/output block of the programmable logic device to the first multiplexer input terminal and the second path of interest extends from a second programmable input/output block of the programmable logic device to the second multiplexer input terminal.

6. The method of claim 5, further comprising programming the first programmable resource to function as a coincidence detector, the coincidence detector having first and second detector input terminals connected to the first and second paths of interest.

7. The method of claim 6, further comprising:
   i. generating a third signal transition on the first input/output block and a fourth signal transition on the second input/output block, the third signal transition separated from the fourth signal transition by a delay period;
   j. monitoring the output terminal of the coincidence detector to determine whether the first and second signal transitions are coincident; and
   k. adjusting the delay period if the third and fourth signal transitions are not coincident.

8. The method of claim 7, further comprising repeating steps i, j, and k until the third and fourth signal transitions are coincident, and storing the adjusted delay period.

9. The method of claim 8, further comprising adding the propagation-delay difference to the adjusted delay period to produce a corrected delay.

10. A method of synchronizing signal transitions on first and second test leads of a circuit tester, the method comprising:
   a. connecting the first and second test leads to respective first and second input/output blocks of a programmable logic device;
   b. programming a first programmable resource on the programmable logic device to function as a multiplexer, the multiplexer having a first multiplexer input terminal connected-to the first input/output block via a first path of interest, a second multiplexer input terminal connected to the second input/output block via a second path of interest, a multiplexer output terminal, and a select terminal, wherein a first logic level on the select terminal connects the first multiplexer input terminal to the multiplexer output terminal and a second logic level on the select terminal connects the second multiplexer input terminal to the multiplexer output terminal;
   c. providing the first logic level on the select terminal;
   d. propagating a first signal transition through the first path of interest to the first multiplexer input terminal, through the multiplexer, and back to the first path of interest, thereby generating a first periodic signal having a first period;
   e. providing the second logic level on the select terminal;
   f. propagating a second signal transition through the second path of interest to the second multiplexer input terminal, through the multiplexer, and back to the second path of interest, thereby generating a second periodic signal having a second period;
   g. subtracting the second delay period from the first delay period to obtain a propagation-delay difference;
   h. instantiating a coincidence detector on the programmable logic device using the first programmable resource, the coincidence detector having a first coincidence-detector input terminal connected to the first input/output block via the first path of interest and a second coincidence-detector input terminal connected to the second input/output block via the second path of interest;
   i. generating a third signal transition on the first test lead and a fourth signal transition on the second test lead, the third signal transition separated from the fourth signal transition by a delay period;
   j. monitoring the output terminal of the coincidence detector to determine whether the third and fourth signal transitions are coincident; and
   k. if the third and fourth signal transitions are not coincident, adjusting the delay period.

11. The method of claim 10, further comprising repeating steps i, j, and k until the third and fourth signal transitions are coincident, and storing the resulting adjusted delay.

12. The method of claim 11, further comprising adding the propagation-delay difference to the adjusted delay period to produce a corrected delay.

13. A programmable logic device comprising:
   a. a first programmable resource configured as a multiplexer, the multiplexer having a first multiplexer input terminal, a second multiplexer input terminal, a multiplexer output terminal, and a select terminal, wherein a first logic level on the select terminal connects the first multiplexer input terminal to the multiplexer output terminal and a second logic level on the select terminal connects the second multiplexer input terminal to the multiplexer output terminal;
   b. a first signal path of interest connected between the multiplexer output terminal and the first multiplexer input terminal; and
   c. a second signal path of interest connected between the multiplexer output terminal and the second multiplexer input terminal;
   d. wherein a signal transition on the multiplexer output terminal traverses the first signal path of interest if the first logic level is applied to the select terminal and traverses the second signal path of interest if the second logic level is applied to the select terminal.

14. The device of claim 13, further comprising a second programmable resource configured as a delay element connected between the multiplexer output terminal and the first and second multiplexer input terminals.

15. A test configuration for a programmable logic device (PLD), the test configuration comprising:
   first and second input/output blocks;
   first and second signal paths extending into the PLD from respective ones of the first and second input/output blocks;
   a ring oscillator configurable to include the first signal path; and
   structure for measuring oscillation period of the ring oscillator.

16. The test configuration of claim 15, wherein the ring oscillator is further configurable to include the second signal path.

* * * * *